(12) United States Patent
Castro Scorsi et al.

(10) Patent No.: US 8,942,300 B1
(45) Date of Patent: Jan. 27, 2015

(54) INTEGRATED DIGITIZER SYSTEM WITH STREAMING INTERFACE

(71) Applicant: National Instruments Corporation, Austin, TX (US)

(72) Inventors: Rafael Castro Scorsi, Round Rock, TX (US); Kunal H. Patel, Austin, TX (US); Hector Rubio, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 13/955,523

(22) Filed: Jul. 31, 2013

(51) Int. Cl.
*H04L 27/00* (2006.01)
*H03M 7/00* (2006.01)
*G04F 10/00* (2006.01)

(52) U.S. Cl.
CPC *H03M 7/00* (2013.01); *G04F 10/00* (2013.01)
USPC ........... 375/259; 375/359; 375/316; 341/126; 341/155; 702/108; 702/118; 702/121; 702/120; 702/122

(58) Field of Classification Search
CPC ............ G06F 11/3632; G06F 11/2733; G06F 11/263; G06F 11/273
USPC ........... 375/316, 259; 341/126, 155; 702/108, 702/118, 120, 121, 122
See application file for complete search history.

(56) References Cited

U.S. PATENT DOCUMENTS

| 6,268,738 | B1 | 7/2001 | Gunthorpe et al. |
| 8,305,903 | B1 * | 11/2012 | Louise et al. ................ 370/241 |
| 8,629,757 | B2 * | 1/2014 | Shimizu et al. ............... 340/5.6 |
| 2008/0074276 | A1 * | 3/2008 | Valencia et al. ............. 340/635 |

OTHER PUBLICATIONS

Steven B. Kaplan, et al.; "A Superconductive Flash Digitizer with On-Chip Memory", IEEE Transactions on Applied Superconductivity, vol. 9, No. 2, Jun. 1999, pp. 3020-2025 (6 pages).

* cited by examiner

*Primary Examiner* — Siu Lee
(74) *Attorney, Agent, or Firm* — Myertons Hood Kivlin Kowert & Goetzel, P.C.; Jeffrey C. Hood (57) ABSTRACT

A digitizer system (DS) may include one or more input channels to receive sample data, and an acquisition state machine (ASM) to organize the sample data into one or more acquisition records according to events of interest, and generate framing information corresponding to the one or more acquisition records. The events of interest may be identified by a trigger circuit in the DS, and relayed to the ASM for organizing the sample data. The DS may further include a data interface capable of receiving the one or more acquisition records and the framing information, encoding the one or more acquisition records and the framing information into encoded data, and transmitting the encoded data to an expansion module. The expansion module may receive the encoded data, decode the encoded data, and recover the sample data from the decoded data according to the framing information and the one or more acquisition records.

32 Claims, 7 Drawing Sheets

INTEGRATED DIGITIZER SYSTEM WITH STREAMING INTERFACE

BACKGROUND OF THE INVENTION

1. Field of the Invention

This invention relates generally to measurement and data acquisition systems and, more particularly, to a data acquisition system with an improved integrated digitizer having a streaming interface.

2. Description of the Related Art

Measurement systems are oftentimes used to perform a variety of functions, including measurement of a physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include a Source-Measure Unit (SMU), which may apply a voltage to a DUT and measure the resulting current, or may apply a current to the DUT and measure the resulting voltage.

Typically, in a measurement or data acquisition process, analog signals are received by a digitizer system, which may reside in a DAQ device or instrumentation device. A digitizer system is a device that uses one or more Analog to Digital Converters (ADC) in order to capture segments of interest of a time varying analog electric signal as a digital representation to be stored and processed by a computer system. There are several important design tradeoffs to be considered when implementing digitizer systems, depending of which components of the system can be included on the same integrated circuit (an integrated circuit can be a custom circuit, such as an application specific integrated circuit [ASIC], or a field programmable gate array [FGPA], among others).

There are presently many different implementations of digitizer systems and streaming interfaces for these systems. One common arrangement includes modular ADCs and integrated complete digitizer systems because the technology process required for the high speed ADCs is usually not the optimal process for the logic required for the other components of the system. Modular ADCs were the motivation behind the specification JESD408, which describes a protocol to transmit data serially between these two components. While designed for high-speed data, the specification is designed to support a continuous stream of data, as generated by the ADC, and lacks a mechanism to define records of data to be stored by the memory system. Current digitizers are typically designed to capture records of data of interest into internal integrated or modular memory.

Other corresponding issues related to the prior art will become apparent to one skilled in the art after comparing such prior art with the present invention as described herein.

SUMMARY OF THE INVENTION

In one set of embodiments, a monolithic, or integrated digitizer system (IDS) may include a trigger detection circuit (TDC) and an acquisition state machine (ASM). The ASM may start and stop sample data acquisition tasks based on trigger events and parameters programmed in the ASM, and may organize data in acquisition records. The IDS may also include a high speed streaming interface (HSSI) transmitter capable of transmitting real time acquisition (sample) data. The ASM may also provide framing information to the HSSI, which frames the sample data according to the organization of the sample data in records, which may be recovered by an HSSI receiver coupled to the HSSI transmitter. The HSSI receiver may be included in an expansion module that receives and consumes (i.e. uses and/or processes) the received sample data. The HSSI may use an appropriate encoding scheme to transmit data and messages from the ASM, including, for example, the insertion of control symbols in the data stream (in addition to the sample data).

The ASM may also generate additional sideband data (timestamps), which may contain information related to the timing and status of each acquisition record. The sideband data may be framed with a different set of control symbols, and may be transmitted through the HSSI interface. In some embodiments, sideband data may also be streamed (e.g. using direct memory access—DMA) through a different path to shared memory. The sideband data may also be stored in local memory. The ASM may use a synchronization mechanism to synchronize the start and stop of data acquisition tasks to other ASMs in other digitizer systems. Accordingly, the sideband data may be used to correlate data from synchronized acquisitions received through the HSSI interfaces without having to synchronize different HSSI interfaces to each other. The record data (i.e. the sample data in a record) may be processed—for example, performing custom digital signal processing (DSP) processes on individual records—after being transferred through the HSSI interface, maintaining the correlation between records among different digitizer systems and without requiring the custom DSP processes to be synchronized to each other.

In one set of embodiments, the ASM may wait for an acknowledge event from the HSSI receiver before acquiring and streaming a new data record or group of records. The ASM may react immediately to the acknowledge event in order to minimize dead acquisition time between records and/or groups of records. In addition, the ASM may wait a pre-defined length of time (referred to as a hold-off period) before starting acquisition of a new record or group of records (i.e. the acquisition of a new set of sample data that is organized/formed into a new record or group of records), in order to more accurately determine (predict) the beginning of the acquisition of the new record or group of records. The acknowledge event from the ASM may be used to detect the proper operation of the system, as well as error conditions. For example, when the acknowledge event is received before the hold-off period expires, the system is considered to be operating properly. When the acknowledge event is received after the hold-off period expires, the latency of the acknowledge event may be interpreted as the detection of an error condition.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only, and are not meant to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

Figure 1:
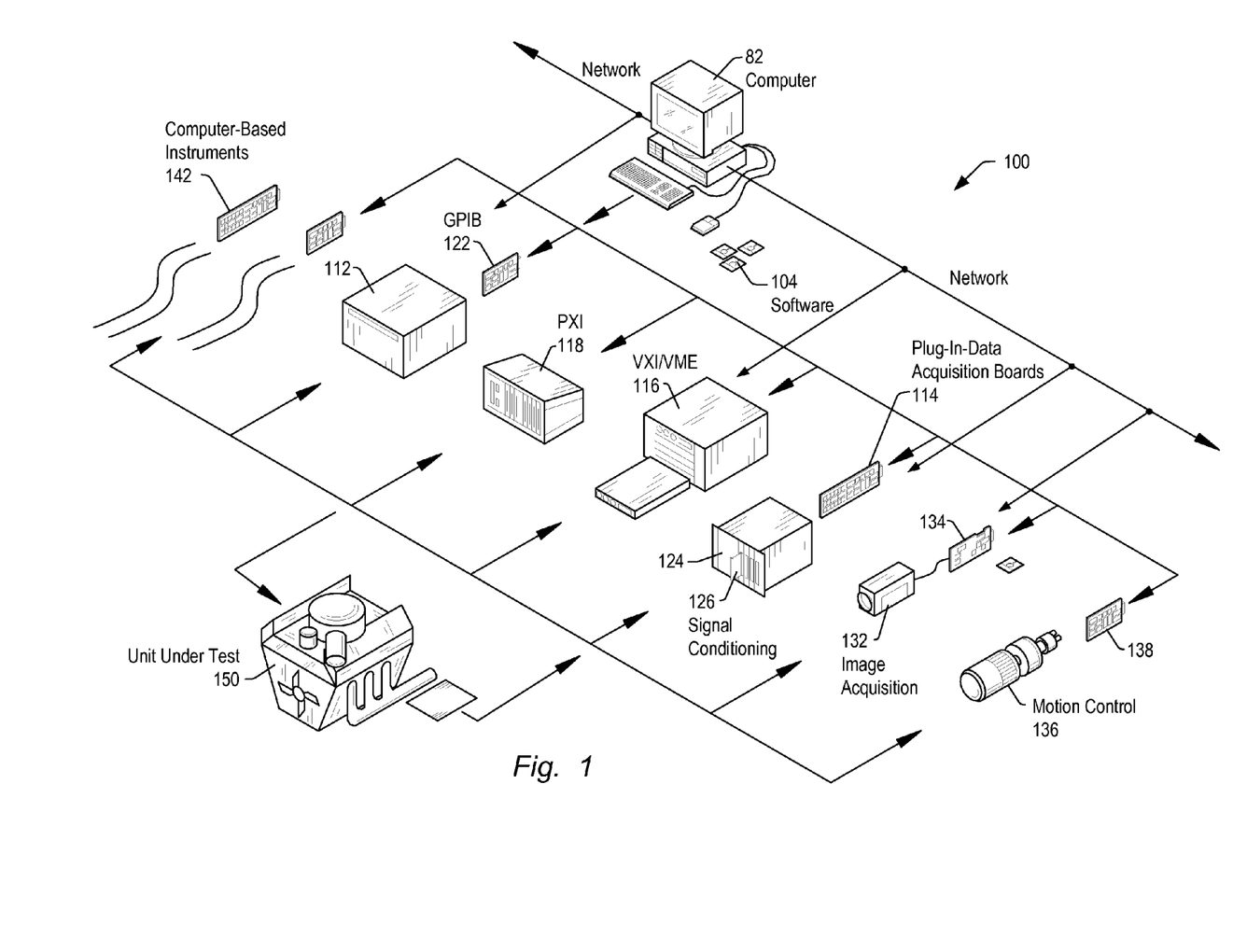
FIG. 1 shows an instrumentation control system with instruments networked together according to one set of embodiments.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
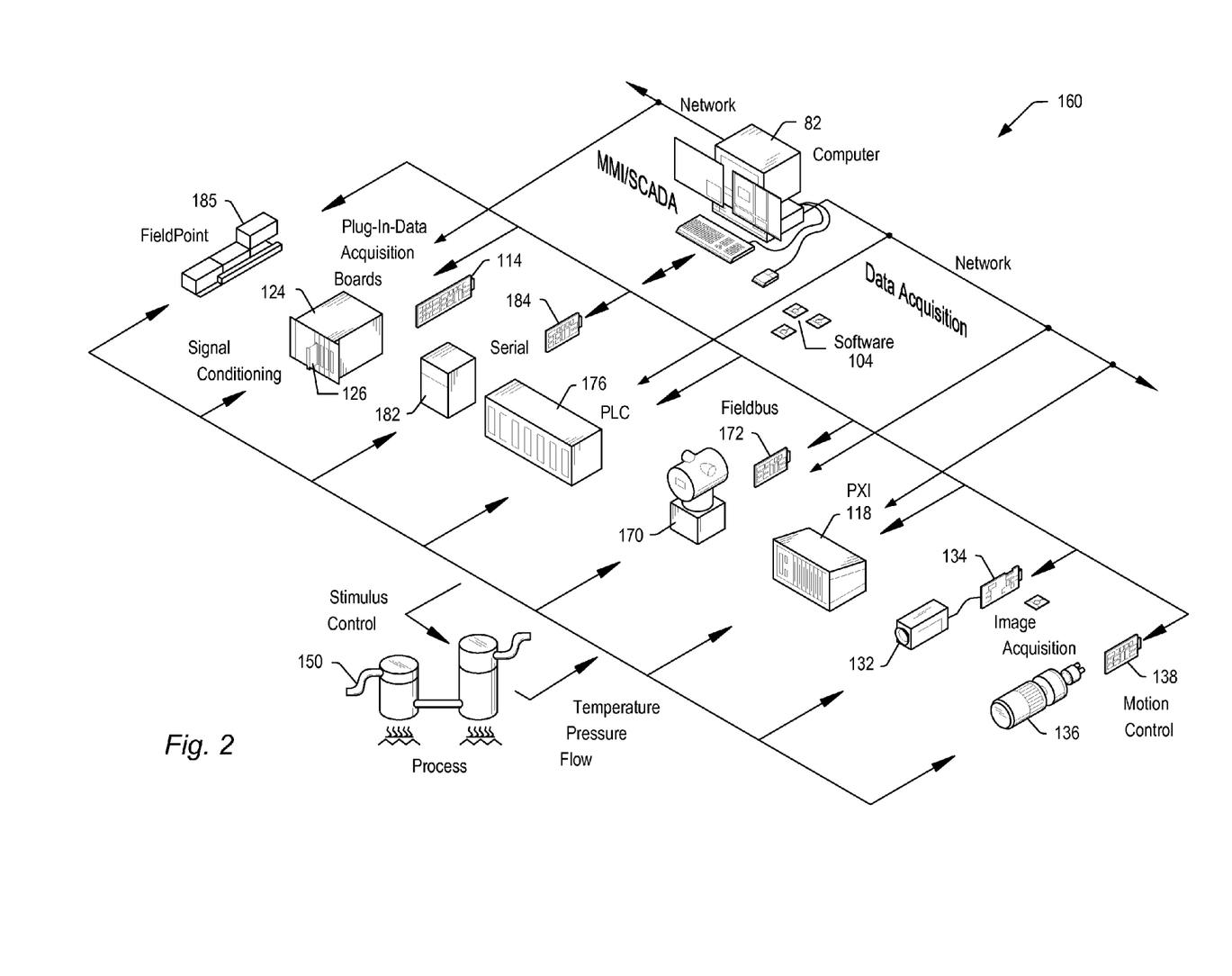
FIG. 2 shows an industrial automation system with instruments networked together according to one set of embodiments.

FIG. 2 illustrates an exemplary industrial automation system 160 that may be configured according to embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, data acquisition (for example through the use of plug-in DAQ boards 114) may be performed using an improved integrated digitizer system with streaming interface. A typical digitizer system generally includes the following components:

One or more analog to digital converters (ADCs), which are usually clocked by synchronized clocks that operate at the same frequency (referred to as sample clocks).

Channel digital signal processing (DSP) Circuits, which may operate on the data captured by each ADC in real time, before the data is used by the trigger circuit or is considered for capture by an Acquisition State Machine (ASM). One example of such a circuit is a digital filter.

A trigger circuit (TC), which is used for detecting events of interest. The events of interest may occur on one or more of the analog signals being digitized or any other external signal provided to the circuit.

An acquisition state machine (ASM), which is used for acquiring segments of the converted signal in response to the occurrence of one or more events of interest detected by the trigger circuit. These segments are referred to as records. For example, the ASM may capture the data necessary to provide visibility into the analog signals for 100 μsec before and after an event of interest captured by the TC. In another example, the ASM may capture the last period of 10 μsec of a signal after a first event of interest but before a second event of interest.

An acquisition data memory system (ADMS), which is used for storing the data acquired by the ASM circuit in a manner that allows the data to be later reconstructed for inspection or for further processing by a computer system. The ADMS may include high bandwidth memory coupled to a memory controller programmable to capture one or more records, and further programmable to receive instructions from the ASM describing the start and end of these records.

As sampling rates and sample resolution increases, inter-IC interfaces for digitizer systems become more complex and require ever increasing levels of power while occupying more board space. While, within an integrated circuit, the frequency of operation and the width of the data path may be designed to operate as fast and be as wide as the logic node and die size allow, respectively. When crossing an inter-IC boundary, the interface may be inherently limited in width, frequency, or both, due to restrictions on package size, board space or electrical characteristics, and power. For example, a communication link in an integrated circuit between the ADC and a trigger circuit may be implemented as a parallel data path of 1024 bits running at 437 MHz in a 65 nm circuit in order to achieve a bandwidth of 56 GB/s (gigabytes per second). It would not be practical to use the same approach if the trigger circuits were implemented in a different IC as the rest of the digitizer system, because the die size and power required for 1024 I/O (input/output) pins would be prohibitive. Instead, a high-speed serial protocol may be used across several high-speed lanes. For example, 48 lanes at 11.2 Gbps (gigabits per second) would be capable of such bandwidth. However, this increases the complexity of the circuit, as these links require several layers of communication circuits in order to provide reliable communication.

Another important aspect (relating to the previous example) is the latency and determinism of the communication link between the two blocks. In the case of the integrated IC, the latency is minimal, as the data exchange between the two blocks may be controlled through the use of one system clock (437 MHz, for example). The interface may also be very deterministic, since the delay to transfer any two points is always the same (one clock cycle). In contrast, in the inter-IC case, the latency may be as long as several microseconds (μsec) due to all the necessary layers of communication circuits for the link. In addition, latency can't always be guaranteed because of great variability in propagation delays in the inter-IC connections, variability in clock phases, and other similar circuitry related aspects. The additional latency and lack of determinism makes the design of precise instruments very complex. For example, the latency and lack of determinism of the communication channel makes it increasingly difficult to react to an event detected by the trigger circuit, perhaps necessitating temporary storage inside the digitizer system to compensate for the latency, and an appropriate algorithm to detect and correct for the variability stemming from the latency.

It is therefore desirable to design and operate a fully integrated digitizer system, or, in other words, to completely integrate all components of a digitizer system. There are, however, other aspects that favor a modular approach. One example is the choice of memory for the ADMS circuit. Integrating the memory along with the other circuits in the system typically results in higher costs and lower memory density than using external memory devices, as the process optimized for circuit design may not be optimal for memory implementation. Furthermore, the internal memory may be fixed to the particular IC, and may therefore not benefit from improvements in density, price and power that are common with commercially available memory (for example double data rate random access memory, i.e., DDR RAM).

Even if the memory itself is designed using a modular approach, a similar argument may be applicable to the memory communication controller. For example, if a DDR3 memory controller is integrated into the design, the memory options for that design (for that system) may be limited to that type of RAM. If the memory controller were implemented, for example, in an FPGA, then it may be easily migrated to a DDR4 design without having to modify the other parts of the digitizer system.

Another aspect in favor of modular design is the ability to provide flexibility for processing the data prior to data storage. If the ADMS is integrated with the rest of the system, data processing needs to be implemented within the system. In contrast, if the ADMS is implemented in an FPGA, the system remains flexible, and further processing may be performed using the FPGA (i.e., in the FPGA) before the data is transmitted to the ADMS. The processing may be user defined and customized to the specific application of the digitizer system.

Integrated Digitizer System with Streaming Interface

In one set of embodiments, an integrated digitizer system (IDS) may include a high-speed streaming interface that allows for a modular ADSM circuit on a different IC than the IC that contains the IDS. The IDS may be implemented with a communication protocol allowing the ASM and the ADSM to communicate through the IC boundary in order to control what data is stored and when new data is acquired. Several other improvements in the context of various embodiments of an IDS are further described in more detail below.

Figure 3:
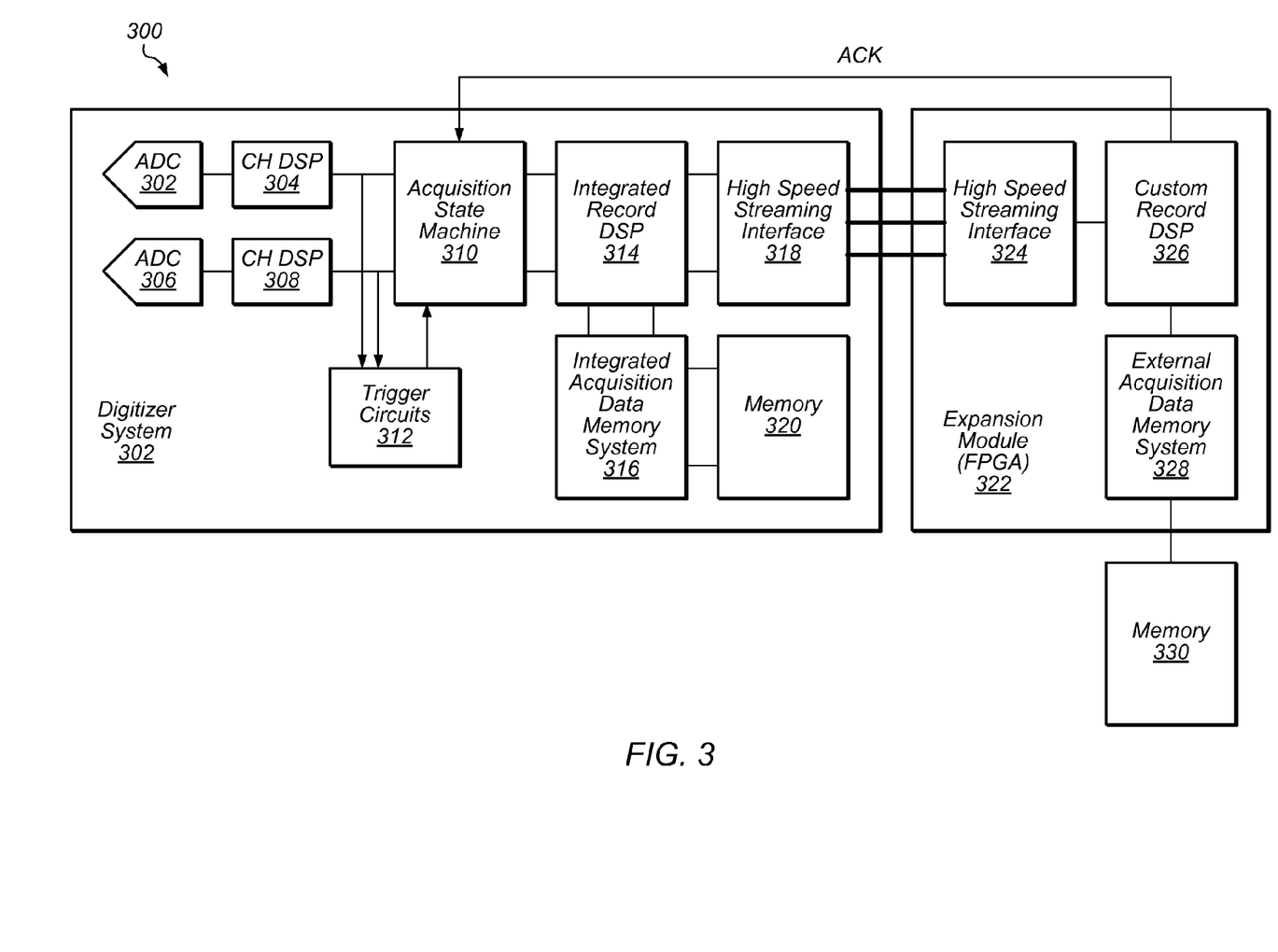
FIG. 3 shows the partial block diagram of one embodiment of a data acquisition system using an integrated digitizer system with a streaming interface.

FIG. 3 shows the block diagram of one embodiment of a digitizer (or data acquisition—DAQ) system 300 that includes an IDS 302 and an expansion IC 322 that includes an ADMS 328. In the embodiment shown in FIG. 3, the expansion 322 is implemented in an FPGA, but alternate embodiments of system 300 might feature an application specific IC or other similar realization of expansion 322 for the purpose of implementing/containing ADMS 328. DAQ system 300 may include several components as shown.

Figure 4:
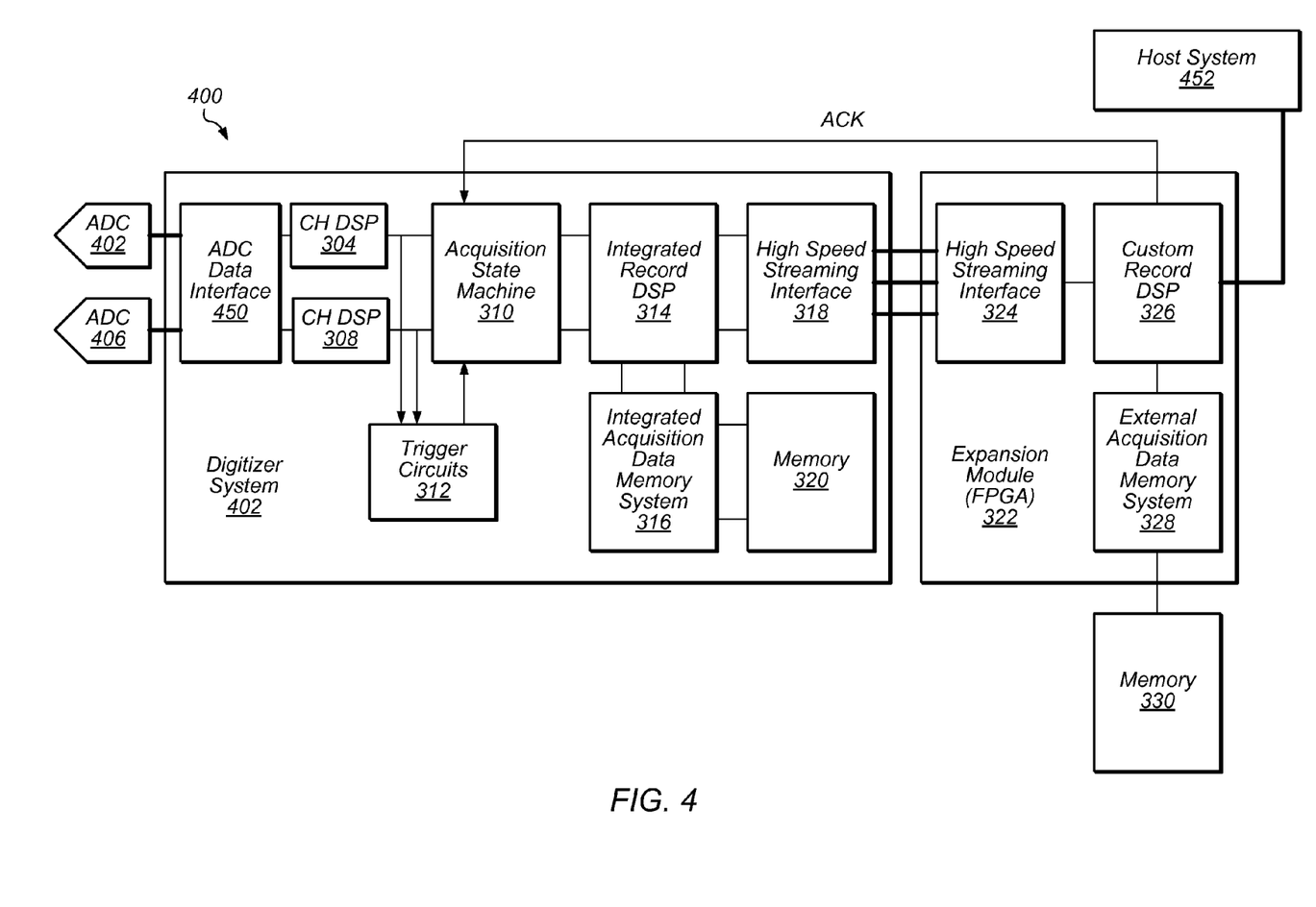
FIG. 4 shows the partial block diagram of another embodiment of a data acquisition system using an integrated digitizer system with a streaming interface.

IDS 302 may include one or more ADCs 302/306 operating at the same frequency and usually at the same sampling phase. FIG. 3 shows two ADCs 302 and 306 for the purposes of illustration, but alternate embodiments may include fewer or more ADCs, for example one ADC per data channel. The ADCs 302/306 may be integrated in the same IC as the rest of the system as shown in FIG. 3, or they may be modular components connected to the Digitizer System through a high-speed ADC interface (such as JESD408B, for example), as illustrated in FIG. 4, where ADCs 402/406 are external to IDS 402. In case of ADCs 402/406, which are external to IDS 402, IDS 402 may include an ADC data interface 450 to receive the data from ADCs 402/406.

IDS 302 may also include channel DSP (CH DSP) blocks 304/308, each corresponding to a respective channel, and hence to a respective ADC of ADCs 304/306. CH DSP blocks 304/308 may be considered optional circuit/functional elements that allow signal processing operations to be applied to the data before its consideration for capture or triggering. That is, CH DSP blocks 304/308 may perform signal processing operations on the received, digitized data prior to the data being captured. Trigger Circuits 312 may inspect the channel data from CH DSP 304/308 and/or data from other external signals in order to detect events of interest. Many such events may be implemented, such as detecting the rising edge on the signal on one channel, or detecting a pulse with specified characteristics, e.g. a pulse having a minimum voltage amplitude and time duration. The trigger circuit 312 may thereby provide events information to the Acquisition State Machine 310. Acquisition State Machine 310 may select data to be acquired, and organize such data in acquisition sets called "records". Overall, trigger circuits 312 and ASM 310 may be considered as operating in concert to detect events of interest on incoming data, and frame the data according to those events of interest.

Each record may be created and organized by ASM 310 in response to the trigger information from trigger circuits 312, from user input, or from another ASM module from a different digitizer system to be synchronized with IDS 302. The records may contain an arbitrary amount of data that may be stored in a circular buffer in the ADMS 328. ASM 310 may be operated to provide record information to ADMS 328, with the record information indicating when data from one record ends, and data from a new record begins, enabling the ADMS to switch to a new circular buffer for the next record. The integrated ADMS 316 is an optional block within IDS 302, providing integrated memory storage to IDS 302, coupling to internal memory 320. Integrated Record DSP 314 is a processing block that may be operated to perform signal processing operations applied to the data records (i.e. records of data) acquired by ASM 310.

A high speed streaming interface (HSSI) block may be used to implement a real time data streaming interface to an external module that includes ADMS 328, e.g. an expansion FPGA 322. HSSI 318 may implement a communication protocol for ASM 310 to communicate framing information corresponding to the data records (e.g. the start and end of data records) to an external circuit in a coherent manner. The elements for a possible embodiment of an expansion FPGA 322 may include a receiver HSSI 324 also implementing the communication protocol used by HSSI 318, thereby receiving the framing information, and reconstructing the data transmitted by IDS 302. The framing information (e.g. messages about the start and end of the records received from ASM 310) may also be reconstructed. Expansion 322 may also include an optional reconfigurable DSP block 626 that performs DSP operations on the received data records. Expansion module 322 also includes ADMS 328 coupled to modular RAM (i.e. DDR3 DRAM) 330, which may part of expansion 322, or external to expansion 322 (as shown in FIG. 3). ADMS 328 may store the data from the records in circular buffers, using the messages (i.e. framing information) received from ASM 310 through HSSI 318 and HSSI 324, to stop writing to the current buffer and move to the next buffer when so warranted by the framing information corresponding to a given record for which the associated data (i.e. the data associated with that record) is currently being written. In addition, DSP 326 may also provide an acknowledge signal (ACK) to ASM 310 to indicate that operations have been performed on data for a given record. It should be noted that as used herein the term "real time" is intended to refer to the (re)transmission (or streaming) of data as it is received (acquired) without the use of storage except for small buffers/FIFOs. For example (referring to FIG. 4), IDS 302 may be streaming data real time to expansion module 322 while expansion module 322 is storing the data in (external) memory 330. Then, once the acquisition of the data is complete, expansion module 322 may store the data in the memory on host system 452. In other words, when data is stored/transmitted subsequent to acquisition of the data being complete, such storing/transmitting is considered to be taking place not in real time.

As previously mentioned, FIG. 4 shows a DAQ subsystem 400 (directed at digitizing data) similar to DAQ subsystem 300, with the difference that ADCs 402 and 406 are external to IDS 402, while ADCs 304 and 306 are internal to IDS 302. Accordingly, IDS 402 also includes an ADC data interface 450 to receive the digitized data (digital data corresponding to the captured analog samples), and provide the data to corresponding respective CH DSPs 304 and 308 for each respective channel. Again, while DAQ subsystem 400 illustrates two channels for the sake of simplicity, alternate embodiments may include additional channels, or a single channel as desired. At least IDS 302 and/or IDS 402 from DAQ subsystems 300 and 400, respectively, may be configured on a DAQ board, for example on a plug-in DAQ board 114 that is shown in FIG. 1 and FIG. 2. Furthermore, FIG. 4 also shows DSP block 326 coupled to a host system 452, e.g. a computer system that includes a central processing unit (CPU). Once DSP block 326 has completed operation on the data (from a record, for example), that is, once it has processed the data, it may provide the processed data to host system 452 for further operation/processing by host system 452.

Interaction Between the ASM and HSSI

ASM 310 may be operated to acquire a certain number of records of data of arbitrary length. The last N samples of each record may be considered to be of interest, and therefore the data may be stored in a circular buffer, and may be read from the circular buffer by storing information corresponding to the record, e.g. by storing timestamps of the start and end of the record. These timestamps may be later translated into pointers in memory, e.g. in memory 330. The ASM 310 may be operated to signal the start and end of a record to downstream circuits because the record is of arbitrary length. In order to transmit the data and the start of record and end of record events in a coherent way through the HSSI 318/324, the information about the events (i.e. the information corresponding to the events) may be embedded in the same data stream. This may be accomplished by encoding the data with a code that allows for data as well as control characters. In general, data of a specific length may be encoded with additional bits representing specific codes, adding to the length of the original data. Examples of such encodings include 8b/10b or 64b/66b, where the first number in each pair represents the length of the data, with two bits added for a respective code, representing the overall length in the second number. Other encodings may also be used.

Considering 64b/66b encoding as an example, every 64-bit data to be sent may be encoded in a 66-bit word. The encoding may include appending two (2) bits to the original data word. When the appended two bits are, for example, "01", the 64b word (i.e. 64-bit word) that immediately follows the appended two bits may be interpreted as sample data. When the two bits are "10", the word that immediately follows the appended two bits may be a control word (or control data) carrying special meaning. That is, the appended bits may be used to denote how the data thereafter is interpreted. The other 2-bit combinations may be reserved and/or not used. For example, in alternate embodiments, the 2-bit combinations unused in the embodiment discussed herein may be used for denoting additional features that may be implemented as desired. The ability to send control words in the same stream with the data allows the HSSI to encode events (or framing information) such as the start of a record and the end of a record. In some embodiments, there may be several different start-of-record and end-of-record symbols to distinguish among several possible events that may have caused the record to be acquired.

The control symbols may also be used to account for gaps in the data introduced by the different clock rates in the acquisition and streaming interfaces. The table below provides one example of possible encoding for the header and the control word, and the possible content of the data word:

| Two bit header | Type of control word | 64-bit data word |
|---|---|---|
| "01" | Word is data | (i.e. 8 samples of 8 bits each) |
| "10" | Control - SOR[i], 0 ≤ i < 256 | 0x00000000 00000Fi ('i' is 8-bit number) |
| "10" | Control - EOR[j], 0 ≤ j < 256 | 0xF0000000 000000j ('j' is 8-bit number) |
| "10" | Control - IDLE | 0xFFFF000 00000000 |
| "11" | Unused | X |
| "00" | Unused | X |

SOR stands for "start-of-record", and EOR stands for "end-of-record".

Figure 5:
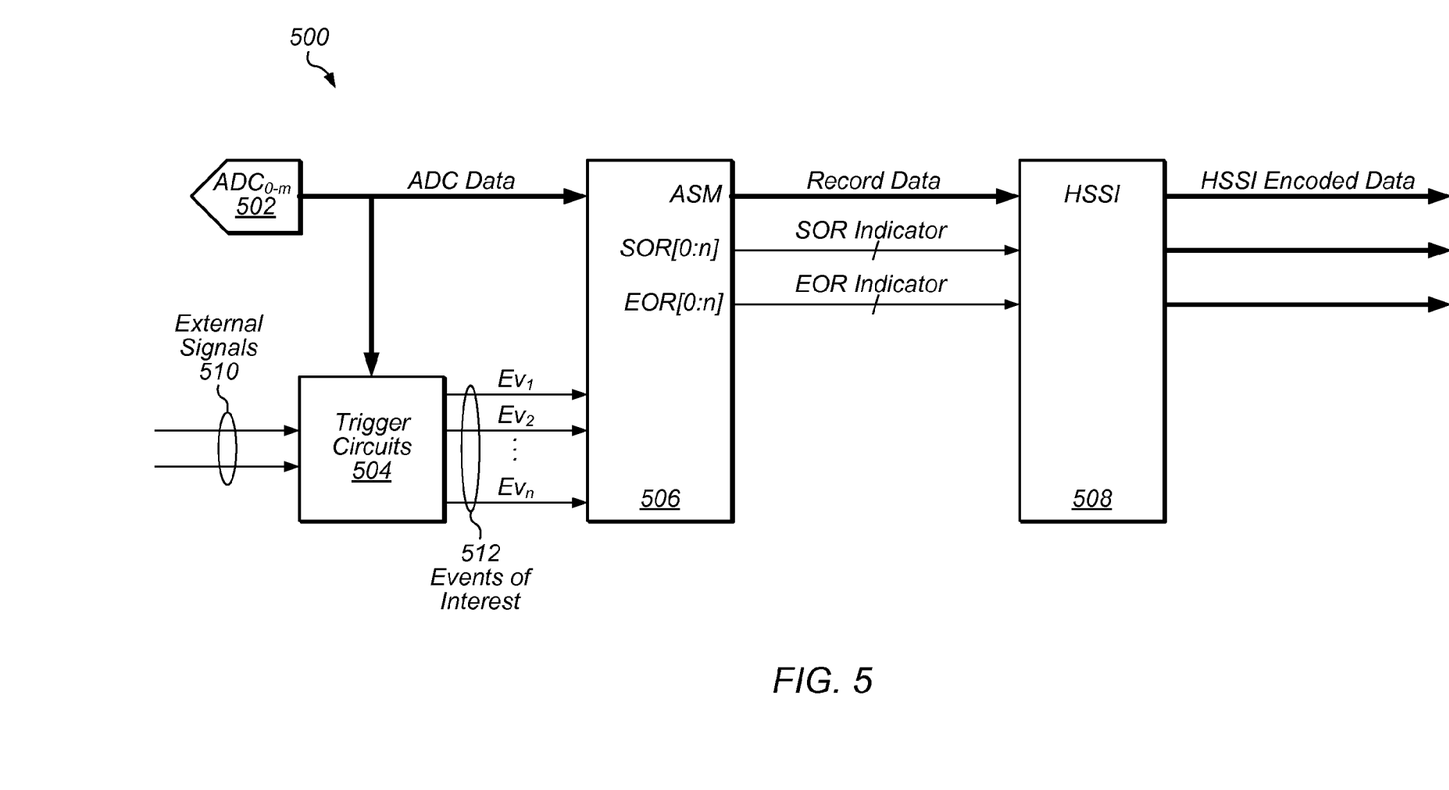
FIG. 5 shows a detailed partial block diagram of one embodiment of a simplified multichannel digitizer system.

FIG. 5 shows the block diagram of a simplified m-channel digitizer system 500. Simplified digitizer 500 may be considered a more detailed representation of the portion of DAQ subsystems 300 and 400 that include the ADCs, trigger circuits, ASM, and HSSI circuitry. The 'm' (where 'm' is a positive integer) channels of the system may be free running and continuously digitizing the signal at their respective inputs using ADCs 502, which may represent 'm' ADCs, or $ADC_{0-m}$, each ADC corresponding to a respective channel. The trigger circuits 504 may detect an event of interest (indicated as $Ev_i$, where 'i' represents an identifying number for the event of interest that has been detected) and this event may be communicated to ASM 506. The event may be caused by inspecting the ADC data or by events indicated to trigger circuits 504 through external signals 510.

In one example, an event of interest $Ev_i$ may be programmed to start an acquisition record, resulting in ASM 506 allowing record data to pass through the circuit. ASM 506 may also communicate the occurrence of the Start Of Record 'i' (SOR[i]) to HSSI 508, coherently with the start of the data record. Prior to the start-of-record, HSSI 508 be operated to continuously transmit the control symbol for IDLE, as no data is to be transmitted up until the time indicating a start-of-record. Upon the arrival of the SOR[i] notification, HSSI 508 may transmit the control symbol for SOR[i], and then proceed to transmit the record data, all part of the HSSI encoded data indicated in FIG. 5.

By design, the bandwidth available at the HSSI 508 is greater than the bandwidth requirement of the record data, in order to accommodate control symbols that were not originally included in the record data, and to compensate for oscillator circuit tolerances that may cause frequency drifts. For example, if the HSSI 508 were designed to be the same bandwidth (BW) as the record data, and due to tolerances the BW of HSSI 508 was smaller than the record data, the interface might overflow.

Figure 6:
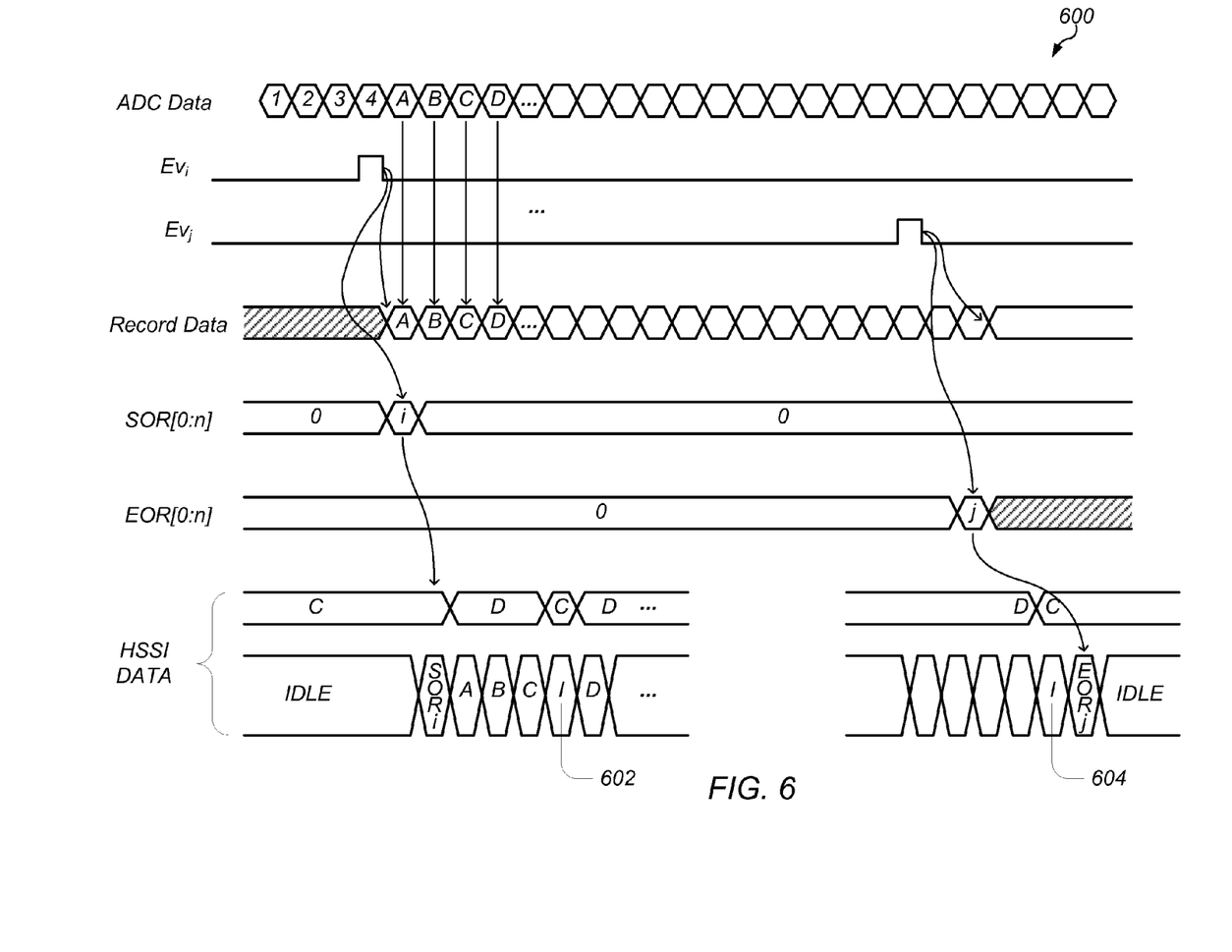
FIG. 6 shows a timing diagram of the data and control signals illustrating operation of the multichannel digitizer system of FIG. 5.

FIG. 6 shows a timing diagram 600 illustrating the signals of interest during operation of simplified digitizer system 500. As indicated in timing diagram 600, transmission of events of interest $Ev_i$ and $Ev_j$ to ASM 506 result in ASM 506 transmitting SOR[i] and EOR[j] indicators to HSSI interface 508 along with the Record Data corresponding to the ADC data during the time period that is bounded by the transmission of SOR[i] and EOR[j]. Consequently, the framing information and record data are all transmitted over the HSSI data bus from HSSI 508 as indicated, with the upper portion representative of the 2-bit header, and the lower portion representative of the subsequent control word/data word as designated in the header. For example, if the header indicates a control word (C), the data word underneath represents control data (such as Idle and/or SOR or EOR framing information). Similarly, if the header indicates record data (D), the data word underneath represents record data corresponding to the Record Data originally obtained from ADCs 502, and transmitted to HSSI 508 by ADM 506.

As also shown in FIG. 6, in order to compensate for the gaps that may appear, IDLE symbols may be inserted by HSSI 508 between data words, as needed. Timing diagram 600 includes IDLE symbols 602 and 604 as examples of such IDLE symbols, and how they may be inserted in the HSSI encoded data stream. At the receiver, for example at HSSI 324 in FIGS. 3 and 4, the HSSI may ignore all IDLE symbols. When the HSSI detects any SOR[x] symbol, it may translate it into a SOR[x] command, ensuring that coherence with the data is maintained. The data after the SOR symbol may also be placed on the internal data bus. Any IDLE symbols within the data stream may also be ignored by the HSSI in the receiver. Finally, EOR[x] symbols may be detected and translated into an EOR command in the internal bus. Referring again to FIGS. 3 and 4, memory controller 328 within expansion module 322 may use the SOR/EOR symbols to decide (e.g. as programmed) where and if and how to store the record data in memory 330.

Multi-System Synchronization

All the information about the timing relation between the digitized data and the ASM inputs such as triggers, user input and inputs from the ASM module of another system may be embedded into the record information by the ASM module (310/506). Because the record information is preserved through the HSSI bus, the HSSI interface becomes a transparent inter-IC interface as the data bus is reconstructed in the expansion module 322 exactly as it appears on IDS 302/402. The latency and indeterminism of the HSSI bus are considered tolerable at this point of the circuit.

The tolerance to indeterminism is particularly important for the case of synchronizing two or more digitizers systems in a way that facilitates reliably comparing and relating in time the data acquired by all the participating digitizer systems for a given record. Two or more ASM modules on different systems may be calibrated and synchronized with respect to their input data such that a data record in each digitizer system corresponds to the information of its respective digitized signal for the same time interval for all digitized signals. Because the synchronization takes place at the ASM, it may be unaffected by the indeterminism of the HSSI bus, and therefore it may be reliably calibrated and repeated for a given system consisting of multiple digitizers. In addition, because the HSSI bus preserves the record information (or in other words, the framing information), the relationship of the records corresponding to different synchronized digitizers may be maintained on the different corresponding expansion modules.

This presents some advantages over current synchronized digitizer systems. One advantage, as previously stated above, is that each synchronized system is tolerant to latency and indeterminism on the HSSI bus. Another advantage is that different expansion modules corresponding to different synchronized digitizer systems do not need to be synchronized themselves, i.e. they do not need to be operated using related clocks that do not drift from one another. As long as the bandwidth available at each HSSI interface is greater than the bandwidth requirement of the synchronized record data, the bandwidth requirements do not need to be the same for all digitizer systems. This second advantage facilitates, for example, the implementation of a custom record DSP on the expansion modules, as exemplified by DSP 326 in FIGS. 3 and 4 for example, and still correlate the DSP processed records on different digitizer systems without the need for the custom DSP to run on synchronized expansion modules (i.e. expansion modules that are synchronized to each other).

Timestamp Streaming (Sideband Data)

Concurrently to sending data and instructions to the HSSI, the ASM (e.g. ASM 310/506) may also create timestamps of the events of interest that cause an acquisition record to start/end. For example, a timestamp may be at its most basic a snapshot of a clock that keeps track of time. By keeping this clock running continuously, the timing of the events may be reconstructed, both within each record and across multiple records. The timestamps may contain additional information. For example, they may contain status of the ASM or the channels themselves. Because there may be many possible timestamps per record, an acquisition with many records may create a parallel stream of timestamp data, also referred to as sideband data. Information represented by sideband data may be inserted in the same data stream transmitted to the HSSI. Accordingly, the HSSI may have a separate asynchronous path for the timestamp data, and may use different control symbols to frame this parallel stream. Similarly, the receiver may identify these symbols, extract the sideband data, and redirect it to a separate path from the sample data. In some embodiments, sideband data may be transmitted through a different streaming mechanism to some shared memory for later use by an application processor (e.g. through a DMA process). This memory may be included in the expansion module (e.g. 322), or it may be system memory from the application processor, or any other memory in the system. In some embodiments, sideband data may be stored in dedicated memory within IDS 402, e.g. within memory 320. Furthermore, the DMA controller may be different or the same for each of the above cases, and may be implemented in any part of the system that would provide the most efficient operation.

Data Flow Control

In some applications, ASM (310/506) may be programmed to acquire no more data than the amount of data that exceeds the receive capacity of the expansion module 322. The ASM may stop acquiring data when that limit is reached. For example, if the expansion module 322 has 4 GB of memory, then a user may program the ASM 310/506 to acquire no more than 4 GB of data for storage in memory. In other applications however, some data may be consumed by the application while new data is being acquired. The consumption of data by the application frees memory space in the expansion module 322, and the freed memory space may be used for more acquisitions. A feedback mechanism may therefore be implemented to notify the ASM 310 when already acquired data has been consumed and the acquisition of new data may proceed. Providing an efficient feedback mechanism may optimize operation and minimize the idle time of IDS 302/402. Therefore, IDS 302/402 may include a hardware feedback mechanism designed to minimize the time from data consumption to when acquisition of new data is started.

In one set of embodiments, the feedback mechanism may include the following features. The ASM may be programmed to pause data acquisition after each acquired record. A feedback signal may be provided from the expansion module 322 to the ASM 310, with the feedback signal providing acknowledgement from the expansion module 322 to the ASM 310 that memory is free, and a new record may be acquired. In some embodiments, the acknowledge signal (ACK) may be provided from custom record DSP 326 as shown in FIGS. 3 and 4. However, in alternate embodiments the ACK signal may be provided from other component(s) within expansion module 322. For every record (i.e. data record, or record of data) that is received at the expansion module 322, the memory controller 328 may store the acquired (record) data, and may begin the consumption process, which may include transferring the data to system memory 330 and/or host system 452, performing some DSP function by custom record DSP 326, or any similar activity. Once the consumption process has been completed, memory controller 328 or DSP 326 (or some other designated component within expansion module 322) may assert the ACK signal to ASM 310, indicating that data acquisition may continue.

Several algorithms or variations of an algorithm may be devised to manage the data acquisition process according to the principles described above. In a first embodiment, the memory controller 328 may actually receive a specified number 'N' of records. The acknowledgement from expansion module 322 may be sent immediately after the reception of the end of record symbol unless all buffers are full. If/when all buffers are full, memory controller 328 may be instructed to wait until the next buffer is free.

In a second embodiment, the ASM 310 may be programmed to acquire N records and then wait for the ACK signal from the expansion module 322 to be asserted. The memory controller 328 (and/or DSP 326) may have been previously programmed or instructed to receive these N records and wait for their consumption before sending acknowledgement (i.e. before asserting the ACK signal) to the ASM 310.

In a third embodiment, the ASM 310 may be programmed to acquire N records before it waits for the ACK signal to be asserted. Memory controller 328 may include a first number (M) of buffers, each buffer holding a second number (N) of records, where 'M' and 'N' are nonzero integers. The ACK signal may be asserted to the ASM 310 immediately upon the reception of each set of N records, unless all M buffers are in use. If that is the case, the memory controller may be instructed/programmed to wait until at least one buffer is free before asserting the ACK signal to the ASM 310.

Figure 7:
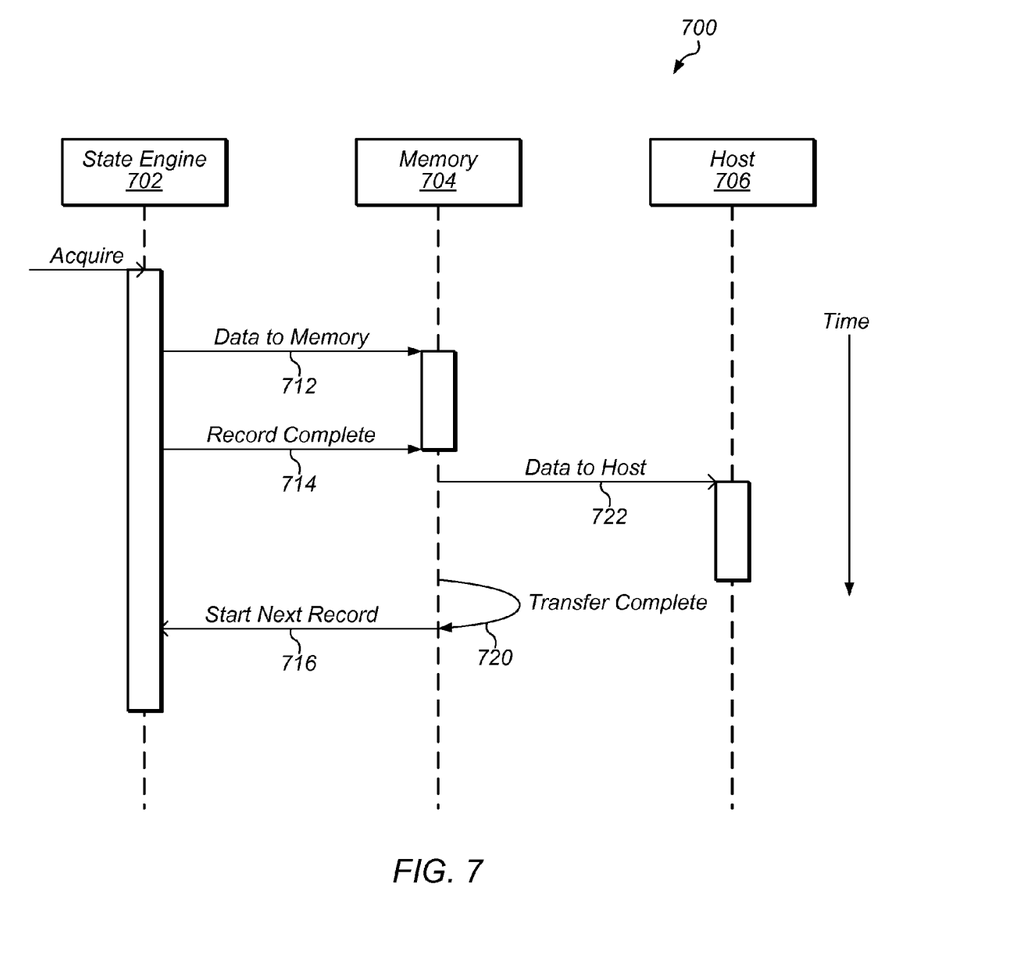
FIG. 7 shows a time flow diagram illustrating the flow of data acquisition process according to one embodiment.

FIG. 7 shows the time flow diagram 700 of a data acquisition process in a system using a digitizer system such as those exemplified in FIGS. 3 and 4, according to one embodiment. As shown in FIG. 7, a state engine 702 may implement control/management of the data acquisition process. State engine may be a finite state machine or programming instruction executed by a controller/processor or any combination of hardware and software. First, sample data may be acquired and sent to memory 704 (712), along with the framing information (or record information), indicated as record complete (714). The sample data may be subsequently consumed as it is transmitted to the system memory of a host system 706 (722). The acknowledgement to start the next record is given (716) when the transfer to host memory is indicated as being complete (720). Further variations of the acquisition process exist and are contemplated, depending on how the ASM 310 reacts to the acknowledge signal from the expansion module 322. In one embodiment, the expansion module 322 may act immediately to transmit the acknowledgement (i.e. assert the ACK signal), minimizing the time between the acquisition of records and/or groups of records.

Alternatively, the ASM 310 may have a hold-off timer programmed to wait for a programmed period of time following the acquisition of a record and/or group of records. This programmed period of time may be set to a value corresponding to a slightly longer period than the expected time it would take to consume the acquired sample data. In such a case, the acknowledge event may be expected to arrive before the timer expires, and the ASM 310 may still wait for the timer to expire before acquiring a new record and/or group of records. If the acknowledge event happens after the hold-off timer expires, it may be indicative of an error condition. In such a case, determining the start time of the records or group of records may be considered more important than the actual time that elapses between the respective starting times of different respective data acquisitions.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A digitizer system comprising:
   one or more input channels configured to receive sample data;
   an acquisition state machine (ASM) configured to perform data acquisition tasks, wherein in performing the data acquisition tasks, the ASM is configured to:
   obtain the sample data from the one or more input channels, and generate one or more acquisition records from the sample data according to events of interest; and
   generate framing information corresponding to the one or more acquisition records; and
   a first data interface configured to:
   receive the one or more acquisition records and the framing information;
   encode the one or more acquisition records and the framing information into encoded data;
   transmit the encoded data, wherein the sample data is recoverable from the encoded data by a second data interface according to the framing information and the one or more acquisition records.

2. The digitizer system of claim 1, further comprising a trigger circuit configured to identify the events of interest, and provide an indication of the events of interest to the ASM;
   wherein in generating the one or more acquisition records, the ASM is configured to generate the one or more acquisition records according to the indication of the events of interest received from the trigger circuit.

3. The digitizer system of claim 1, wherein the ASM is programmable with one or more parameters, wherein the ASM is further configured to start and stop the data acquisition tasks according to the events of interest and the one or more parameters programmed into the ASM.

4. The digitizer system of claim 1, wherein the first data interface is configured to transmit the encoded data in real time.

5. The digitizer system of claim 1, wherein in encoding the one or more acquisition records and the framing information into encoded data, the first data interface is configured to insert control symbols into a data stream comprising the one or more acquisition records and the framing information, and transmit the data stream comprising the control symbols, the one or more acquisition records, and the framing information, as the encoded data.

6. The digitizer system of claim 1, wherein the ASM is further configured to generate sideband data comprising information related to timing and status of each acquisition record of the one or more acquisition records.

7. The digitizer system of claim 6, wherein the first data interface is further configured to encode the sideband data into the encoded data.

8. The digitizer system of claim 6, wherein the digitizer system further comprises local memory, wherein the digitizer system is configured to store the sideband data in the local memory.

9. The digitizer system of claim 6, wherein the digitizer system further comprises the second data interface, wherein the second data interface is configured to stream the sideband data to a shared memory.

10. The digitizer system of claim 1, wherein the ASM is further configured to start and stop the data acquisition tasks in synchronization with one or more additional ASMs configured in respective one or more additional digitizer systems.

11. The digitizer system of claim 10, wherein the ASM is further configured to:
   generate sideband data comprising information related to timing and status of each acquisition record of the one or more acquisition records; and use the sideband data to synchronize the start and stop of the data acquisition tasks with the one or more additional ASMs.

12. The digitizer system of claim 11, wherein the ASM is further configured to encode the sideband data into the encoded data;
wherein the digitizer system further comprises an expansion module that comprises:
the second data interface, wherein the second data interface is configured to receive the encoded data, and recover the sample data from the received encoded data according to the framing information and the one or more acquisition records; and
signal processing circuitry configured to process the recovered sample data, and use the sideband information to maintain a correlation between the processed sample data and additional sample data contained in respective acquisition records generated by the one or more additional ASMs.

13. The digitizer system of claim 1, wherein when generating more than one acquisition record, the ASM is configured to wait for an acknowledge event upon having generated an acquisition record before obtaining more sample data and generating a next acquisition record.

14. The digitizer system of claim 13, wherein the ASM is configured to start obtaining more sample data and generating a next acquisition record immediately after receiving the acknowledge event.

15. The digitizer system of claim 13, wherein the ASM is configured to wait for a time period of specified length upon having completed generating a present acquisition record, before beginning to obtain more sample data and generating a next acquisition record.

16. The digitizer system of claim 15, wherein the ASM is further configured to:
indicate to the digitizer system that an error has occurred if the acknowledge event corresponding to the present acquisition record is received after the time period has elapsed; and
continue normal operation if the acknowledge event corresponding to the present acquisition record is received before the time period elapses.

17. A method for performing data acquisition, the method comprising:
receiving sample data over one or more input channels;
performing data acquisition tasks, comprising:
obtaining the sample data from the one or more input channels, and generating one or more acquisition records from the sample data according to events of interest corresponding to the sample data; and
generating framing information corresponding to the one or more acquisition records;
receiving the one or more acquisition records and the framing information at a first data interface;
encoding the one or more acquisition records and the framing information into encoded data; and
transmitting the encoded data via the first data interface, wherein the sample data is recoverable from the encoded data by a second data interface according to the framing information and the one or more acquisition records.

18. The method of claim 17, further comprising:
receiving one or more external signals corresponding to the sample data; and
generating the events of interest according to the received one or more external signals.

19. The method of claim 17, wherein said performing the data acquisition tasks comprises:
starting and stopping the data acquisition tasks according to the events of interest and one or more programmable parameters.

20. The method of claim 17, wherein said transmitting the encoded data comprises transmitting the encoded data in real time.

21. The method of claim 17, wherein said encoding comprises:
inserting control symbols into a data stream comprising the one or more acquisition records and the framing information; and
transmitting the data stream comprising the control symbols, the one or more acquisition records, and the framing information, as the encoded data.

22. The method of claim 17, further comprising:
generating sideband data comprising information related to timing and status of each acquisition record of the one or more acquisition records.

23. The method of claim 22, wherein said encoding comprises encoding the sideband data into the encoded data.

24. The method of claim 22, further comprising storing the sideband data in local memory.

25. The method of claim 22, further comprising streaming the sideband data to a shared memory via the second data interface, wherein the shared memory is shared by at a first system comprising the first data interface and at least one other system not comprising the first data interface.

26. The method of claim 17, wherein said performing the data acquisition tasks comprises:
starting and stopping the data acquisition tasks in synchronization with one or more other data acquisition tasks performed by one or more other systems not comprising the first data interface.

27. The method of claim 26, further comprising:
generating sideband data comprising information related to timing and status of each acquisition record of the one or more acquisition records;
wherein said performing the data acquisition tasks comprises performing said starting and stopping the data acquisition tasks in synchronization with the one or more other data acquisition tasks according to the sideband data.

28. The method of claim 27, wherein said encoding comprises encoding the sideband data into the encoded data;
wherein the method further comprises:
receiving the encoded data at a second data interface, and recovering the sample data from the received encoded data according to the framing information and the one or more acquisition records;
processing the recovered sample data; and
maintaining a correlation, using the sideband information, between the processed sample data and additional sample data contained in respective acquisition records generated by the one or more other systems.

29. The method of claim 17, wherein said performing the data acquisition tasks further comprises:
generating a plurality of acquisition records; and
waiting for an acknowledge event upon having generated a present acquisition record of the one or more acquisition records, before obtaining more sample data and generating a next acquisition record.

30. The method of claim 29, wherein said performing the data acquisition tasks further comprises:
starting obtaining more sample data and generating a next acquisition record immediately after receiving the acknowledge event.

31. The method of claim 29, wherein said performing the data acquisition tasks further comprises:
   waiting for a time period of specified length upon having completed generating the present acquisition record.

32. The method of claim 31, further comprising:
   indicating that an error has occurred responsive to receiving the acknowledge event corresponding to the present acquisition record after the time period has elapsed; and
   continuing normal operation responsive to receiving the acknowledge event corresponding to the present acquisition record before the time period elapses.

\* \* \* \* \*

UNITED STATES PATENT AND TRADEMARK OFFICE
CERTIFICATE OF CORRECTION

| | | |
|---|---|---|
| PATENT NO. | : 8,942,300 B1 | Page 1 of 1 |
| APPLICATION NO. | : 13/955523 | |
| DATED | : January 27, 2015 | |
| INVENTOR(S) | : Castro Scorsi et al. | |

It is certified that error appears in the above-identified patent and that said Letters Patent is hereby corrected as shown below:

Title page:

(74) *Attorney, Agent, or Firm*:
please delete "Myertons" and substitute -- Meyertons --.

Signed and Sealed this
Fifth Day of May, 2015

Michelle K. Lee
*Director of the United States Patent and Trademark Office*